United States Patent [19]

Sakai

[11] Patent Number: 5,459,104

[45] Date of Patent: Oct. 17, 1995

[54] PROCESS FOR PRODUCTION OF SEMICONDUCTOR SUBSTRATE

[75] Inventor: Shinsuke Sakai, Tokyo, Japan

[73] Assignee: Mitsubishi Materials Silicon Corporation, Tokyo, Japan

[21] Appl. No.: 307,620

[22] PCT Filed: Jan. 18, 1994

[86] PCT No.: PCT/JP94/00058

§ 371 Date: Sep. 19, 1994

§ 102(e) Date: Sep. 19, 1994

[30] Foreign Application Priority Data

Jan. 18, 1993 [JP] Japan .................................. 5-005818
Jan. 18, 1993 [JP] Japan .................................. 5-005819

[51] Int. Cl.$^6$ ........................................... H01L 21/302
[52] U.S. Cl. ........................... 437/225; 437/62; 437/974; 148/DIG. 12; 148/DIG. 135
[58] Field of Search ................... 437/62, 974, 225; 148/DIG. 12, DIG. 135

[56] References Cited

U.S. PATENT DOCUMENTS

| | | | |
|---|---|---|---|
| 4,057,939 | 11/1977 | Basi | 51/281 R |
| 4,879,258 | 11/1989 | Fisher | 437/974 |
| 4,954,142 | 9/1990 | Carr et al. | 51/309 |
| 4,971,925 | 11/1990 | Alexander et al. | 437/62 |
| 5,260,233 | 11/1993 | Buti et al. | 148/DIG. 135 |
| 5,356,833 | 10/1994 | Maniar et al. | 437/187 |

FOREIGN PATENT DOCUMENTS

| | | |
|---|---|---|
| 2-177433 | 7/1990 | Japan . |
| 2-280357 | 11/1990 | Japan . |
| 4-75338 | 3/1992 | Japan . |

*Primary Examiner*—Brian Hearn
*Assistant Examiner*—Trung Dang
*Attorney, Agent, or Firm*—Knobbe, Martens, Olson & Bear

[57] ABSTRACT

The invention relates to a process of production of a semiconductor substrate by binding etc. involving the direct polishing of an oxide film with step differences. A silicon oxide film (3) having step differences is formed on at least one surface of an active layer substrate (A). This silicon oxide film (3) is polished by a rigid platen using a polishing agent comprised primarily of cerium oxide. A support substrate (B) is laminated to the bonding face (3a) this obtained to obtain a wafer of a SOI structure. This enables elimination of the polycrystalline silicon layer on the silicon oxide film which had been formed only for bonding purposes.

9 Claims, 7 Drawing Sheets

WARPAGE OF WAFER

PROCESS FOR PRODUCTION OF SEMICONDUCTOR SUBSTRATE

TECHNICAL FIELD

The present invention relates to a process for production of a semiconductor substrate. More particularly, it relates to a process for polishing a semiconductor substrate which simplifies the step of forming a bonding face in a thin film silicon on insulation (SOI) structure substrate, a process for production of a semiconductor substrate using this process of polishing, a process for polishing at the time of polishing the bonding face of a thin film SOI structure substrate having a insulating layer, and a process for production of a semiconductor substrate using this process of polishing.

BACKGROUND ART

In forming a semiconductor substrate, compared with the technique of building the integrated circuit into a bulk semiconductor substrate, the technique of forming various devices on a thin film semiconductor layer provided on an oxide insulating layer gives superior operating speeds, α-ray blocking properties, and other device properties and further is more advantageous in terms of the isolation of the devices. This type of semiconductor substrate is called an SOI (silicon on insulator) structure substrate. In such an SOI structure substrate, the thinner the active layer forming the devices is made, the more the parasitic capacitance of the PN junction can be reduced and the higher the operating speed of the devices can be made, so studies have been made on making superthin active layers.

As one technique for obtaining a thin film SOI structure substrate, the so-called binding method is known. FIGS. 7a to 7e are cross-sectional views showing the process for production of an SOI structure substrate by the conventional binding method.

In this process of production, first, an oxide film 3 comprised of $SiO_2$ is formed on the surface of a silicon substrate 1 (hereinafter also referred to as the active layer substrate 1 or active layer substrate A) which has been patterned (shown as the pattern 2) (see FIG. 7a). A bonding layer 4 comprised of polycrystalline silicon is then formed on this oxide film 3 (see FIG. 7b).

Next, the surface of the bonding layer 4 is subjected to chemical-mechanical polishing to flatten it (see FIG. 7c), another silicon substrate (hereinafter also referred to as the support substrate 5 or the support substrate B) is laminated on the polishing face (bonding surface) 4a (see FIG. 7d), then the surface of the active layer substrate 1 is ground and selectively polished until the oxide film 3 is exposed (see FIG. 7e). In this way, it is possible to obtain an SOI structure substrate.

The polycrystalline silicon layer 4 of the SOI structure substrate produced by the conventional process is a layer formed with the objective of burying and flattening the step differences in the patterned oxide film and does not perform any special function after the support substrate is laminated.

In the conventional binding process, it was not possible to eliminate the step of forming the polycrystalline silicon layer (FIG. 7b) so long as the oxide film had step differences in that it was necessary to obtain a flat bonding surface 4a.

Therefore, the inventor of this application took note of the fact that if a satisfactory degree of flatness could be obtained by directly polishing the silicon oxide film formed on the surface of the silicon substrate, it would be possible to eliminate the step of forming the polycrystalline silicon layer. He engaged in intensive research and studies on techniques for polishing a silicon oxide film and as a result confirmed that by suitably constituting the polishing agent and process of polishing, it was possible to obtain a polished face able to satisfy the requirement for flatness in binding and thereby perfected the first aspect of this invention.

Further, he confirmed that by suitably constituting the polishing step using a polishing agent with a different ratio of selective polishing between the silicon and oxide film, it was possible to obtain a polished face able to satisfy the requirement for flatness in binding and thereby perfected the second aspect of this invention.

DISCLOSURE OF THE INVENTION

The present invention was made in consideration of these problems in the prior art and has as its first object the simplification of the binding and other steps of fabrication of a semiconductor substrate by the direct polishing of the oxide film having step differences.

Further, it has as its second object obtaining a semiconductor substrate of a thin film SOI structure using binding and other techniques by using a selective polishing ratio between the semiconductor and oxide film and directly polishing the oxide film using a rigid platen.

To achieve the first object of the present invention, there is provided a process for polishing a semiconductor substrate according to a first aspect of the invention characterized by polishing an oxide film formed on a surface of a semiconductor substrate and having step differences by a rigid platen using a polishing agent comprised primarily of cerium oxide.

To achieve the above first object, there is further provided a process for production of a semiconductor substrate according to the first aspect of the invention characterized by forming an oxide film having step differences on at least one side of one semiconductor substrate and polishing the oxide film by a rigid platen using a polishing agent comprised primarily of cerium oxide to form a bonding face, then laminating another semiconductor substrate on the bonding face.

In the process for polishing a semiconductor substrate according to the first aspect of the invention, an oxide film with step differences formed by patterning on the surface of the semiconductor substrate is directly polished using a polishing agent comprised primarily of cerium oxide and a rigid platen.

By this polishing of the semiconductor substrate using a rigid platen, the substrate as a whole is polished flat. Further, since use is made of a polishing agent comprised primarily of cerium oxide, it is possible to polish the oxide film directly and as a result it is possible to obtain a polished face having a superior flatness.

Accordingly, for example, it is possible to use this as the bonding face in binding etc. and, when producing an SOI structure semiconductor substrate etc., it is possible to eliminate the step of forming a polycrystalline silicon layer required only for forming the flat bonding face.

On the other hand, to achieve the second object, there is provided a process for polishing a semiconductor substrate according to a second aspect of the invention characterized by using a polishing agent comprised primarily of cerium oxide adjusted to an equal or greater ratio of selective polishing of an oxide film to the semiconductor so as to polish by a rigid platen an oxide film patterned on the surface of the semiconductor substrate.

The second object can also be achieved by a process for polishing a semiconductor substrate characterized in that the polished face obtained by this process of polishing is further polished by a rigid platen using a polishing agent adjusted to an equal or greater ratio of selective polishing of the semiconductor to the oxide film.

Further, to achieve the second object, there is provided a process for polishing a semiconductor substrate according to the second aspect of the invention characterized by using a polishing agent comprised primarily of cerium oxide adjusted to a slightly smaller ratio of selective polishing of an oxide film to the semiconductor so as to polish by a rigid platen an oxide film patterned on the surface of the semiconductor substrate.

The second object can also be achieved by a process for polishing a semiconductor substrate characterized in that the polished face obtained by this process of polishing is further polished by a rigid platen using a polishing agent comprised primarily of cerium oxide adjusted to an equal or greater ratio of selective polishing of the oxide film to the semiconductor.

In polishing the oxide film patterned on the front surface of the semiconductor substrate, it is preferable to first form an oxide film on the back surface of the semiconductor substrate and alternately polish the oxide films formed on the front and back surfaces of the semiconductor substrate.

Further, the second object can be achieved by a process for production of a semiconductor substrate characterized by laminating another semiconductor substrate to the polished face obtained by this process of polishing a semiconductor substrate.

As suggested in the above first aspect of the invention, if use is made of cerium oxide as a polishing agent, it is possible to directly polish the oxide film formed on the surface of the semiconductor substrate.

In addition, if the pH of the polishing agent comprised mainly of cerium oxide is suitably set, it is possible to adjust the selective polishing ratio between the semiconductor and the oxide film. For example, if the polishing agent comprised mainly of the cerium oxide is adjusted to a neutral one, the selective polishing ratio of the silicon and silicon oxide becomes 1:4. On the other hand, if the pH of the polishing agent comprised mainly of the cerium oxide is adjusted to 9 to 11, the selective polishing ratio of the silicon and silicon oxide becomes 1:0.8.

In the process of polishing of the semiconductor substrate according to the second aspect of the invention, first, use is made of either a polishing agent comprised mainly of cerium oxide adjusted to a equal or greater selective polishing ratio of the oxide film to the semiconductor (hereinafter referred to as the polishing agent T) or a polishing agent comprised mainly of cerium oxide adjusted to a slightly smaller selective polishing ratio of the oxide film to the semiconductor (hereinafter referred to as the polishing agent W) so as to polish the oxide film patterned on the surface of the semiconductor substrate.

By this, the oxide film is further polished. When polished until the patterned semiconductor substrate is exposed, if use is made of the polishing agent T, since the polishing ratio of the semiconductor is smaller than the oxide film, the patterning of the semiconductor serves as a polishing stopper and as a result the oxide film is polished flat without inclination.

On the other hand, when the polishing agent W is used, the polishing ratio of the semiconductor is greater than the oxide film, so the oxide film serves as a polishing stopper and as a result the semiconductor side is slightly deeper polished and the surface is polished flat with the oxide film protruding out from the polished face.

Next, this polished face is further polished by another polishing agent. First, when polishing was performed in the previous step by the polishing agent T, since the pattern of the oxide film is recessed, polishing is performed using a polishing agent comprised mainly of cerium oxide adjusted to an equal or greater selective polishing ratio of the semiconductor to the oxide film. By this, just the semiconductor protruding out from the polished face without being polished in the previous step is selectively polished and as a result the polished face is flattened.

On the other hand, when polishing using the polishing agent W in a former step, the pattern of the semiconductor is recessed, so use is made of a polishing agent adjusted to have an equal or greater ratio of selective polishing of the oxide film to the semiconductor. By this, just the oxide film not polished in the previous step and protruding from the polished face is selectively polished and as a result the polished face is flattened.

Further, by laminating another semiconductor substrate on the polished face obtained by this process of polishing, it is possible to obtain a semiconductor substrate of a thin film SOI structure having a burying insulating layer.

BRIEF DESCRIPTION OF THE DRAWINGS

FIGS. 2a and 2b are views showing the results of polishing by the process of polishing according to the first aspect of the invention, wherein FIG. 2a shows the surface smoothness before polishing and FIG. 2b shows the surface smoothness after polishing, FIGS. 5a and 5b are views showing the results of polishing by process of polishing according to the second aspect of the invention, wherein FIG. 5a shows the surface smoothness after polishing of step in FIG. 3b and FIG. 5b shows the surface smoothness after polishing of step of FIG. 4b, FIGS. 6a to 6e are cross-sectional views of another embodiment of the second invention.

BEST MODE FOR CARRYING OUT THE INVENTION

Embodiments of the present invention will be explained below with reference to the drawings.

First Embodiment

Figure 1A:
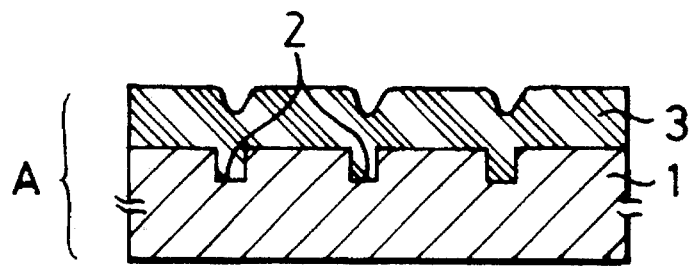
FIGS. 1a to 1d are cross-sectional views of a process of production of a semiconductor substrate according to a first embodiment of the first aspect of the invention.

FIG. 1a are cross-sectional views showing a process for production of a semiconductor substrate according to one embodiment of the first aspect of the invention and explains as one example a process for fabricating a silicon wafer of the SOI structure.

First, as shown in FIG. 1a, a photolithographic or etching technique is used to form grooves 2 of a depth of 0.1 μm at intervals of 500 μm, for example, on one surface of a semiconductor substrate 1 comprised of a single crystal silicon (hereinafter also referred to as the active layer substrate A or the active layer substrate 1).

This surface is thermally oxidized to form an $SiO_2$ film of a thickness of 0.1 μm and then the CVD method is used to form an $SiO_2$ film of a thickness of 0.9 μm on the thus thermally oxidized $SiO_2$ film.

The 1.0 μm $SiO_2$ film constitutes the surface layer of the active layer substrate 3 (hereinafter also referred to as the oxide film 3 or the silicon oxide film 3), but this oxide film 3 is formed as a surface with step differences as shown in the figure in accordance with the shape of the surface of the patterned active layer substrate A.

In the conventional binding step, a polycrystalline silicon film serving as the bonding face was formed on the surface of the oxide film 3 in addition to the structure shown in FIG. 1a, but in the process of production according to the first aspect of the invention, the oxide film 3 is directly polished.

In the polishing of the oxide film 3, use is made of a polishing agent containing cerium oxide $CeO_2$ as its main component. The solid content (NV) of the cerium oxide in the polishing agent is not particularly limited, but use may be made of one of about 1 to 10 percent. Further, the pH of the polishing agent is not particularly limited, but it is advantageous to the polishing performance of the silicon oxide film if the pH is adjusted to a neutral one of about 7.

Figure 1B:
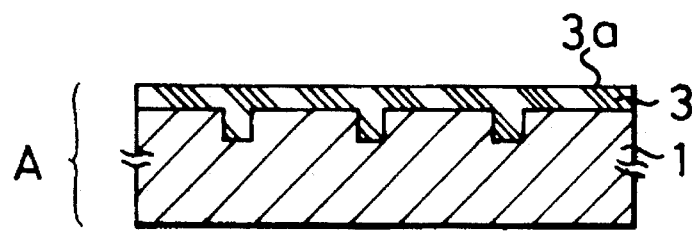

In the polishing step shown in FIG. 1b, polishing is performed using the above-mentioned polishing agent and a rigid platen. The rigid platen is comprised of a flat plate, for example, ceramic, not susceptible to mechanical or heat deformation. On the surface of the polishing face of this rigid platen, it is possible to apply a thin coat of a hot melt wax having mixed in it a polishing agent comprised primarily of cerium oxide.

In the conventional polishing using a cloth, in particular when there were step differences in the polished face, the elastically deformed cloth would polish even the recessed portions of the step differences by about the same polishing speed as the general surface and therefore it was extremely difficult to flatten the mirror surface.

However, in the process for polishing of the present embodiment, since use is made of a rigid platen which free from elastic deformation, if the polished face has the step differences as shown in FIG. 1a, first just the protruding portions pressed against by the platen are gradually polished. In this way, the step differences between the protruding portions and the recessed portions are gradually reduced and as a result it is possible to obtain a flat mirror surface.

Figure 2A:
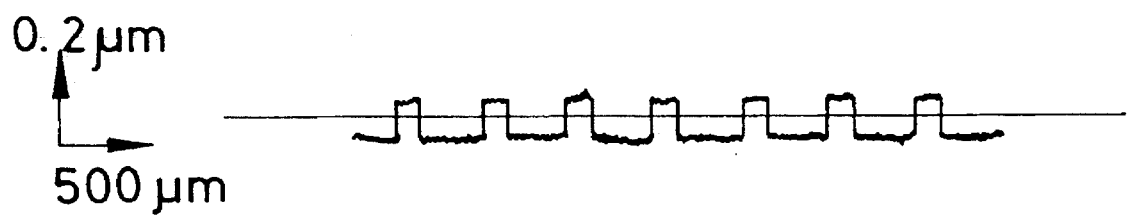
Figure 2B:

The results of the polishing of the silicon oxide film 3 by the polishing agent and the rigid platen are shown in FIGS. 2a and 2b.

FIG. 2a is a chart of the measurement of the surface of the silicon oxide film 3 before the polishing by a surface roughness meter. Step differences of the silicon oxide film of about 0.1 μm are observed.

As opposed to this, FIG. 2b is a chart of the measurement by a surface roughness meter of the state after polishing the silicon oxide film shown in FIG. 2a under conditions of a polishing pressure of 200 g/cm², a relative speed of the polishing agent and wafer of 75 rpm, and a polishing speed of 70 nm/min using a polishing agent comprised primarily of cerium oxide according to the present invention and a rigid platen.

As clear from the results, it was confirmed that the surface smoothness of the silicon oxide film 3 fully satisfied the requirement of being not more than 5 nm for the binding and that the process for polishing of the present invention gives a bonding face 3a of a mirror surface state.

By the above step, one of the semiconductor substrates for constituting the SOI structure wafer, that is, the active layer substrate A, is obtained.

Once having obtained the bonding face 3a with the mirror surface state shown in FIG. 1c, another semiconductor substrate 5 serving as the support substrate B (hereinafter also referred to as the support substrate 5) is brought into close contact with the bonding face 3a and heat bonding is caused by hydrogen bonds to laminate the two (see FIG. 1d).

The binding strength is preferably for example at least 200 kg/cm² and the binding temperature 1100° C. Further, to prevent warpage of the SOI wafer due to the difference of heat deformation, it is preferable to use the same silicon substrate as the active layer substrate 1 for the support substrate 5.

Figure 1C:
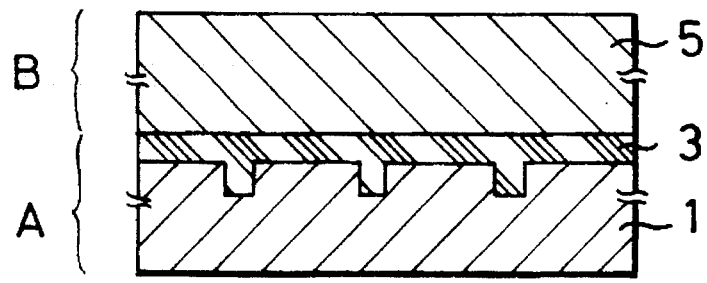

As shown in FIG. 1c, after the binding of the active layer substrate A and the support substrate B, the peripheral side portions are chamfered etc. and grinding is performed to give a thickness of the active layer substrate 1 of about 2 μm.

Figure 1D:
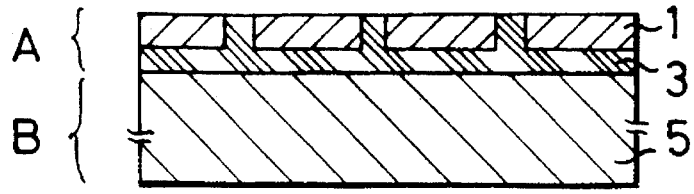

Finally, the active layer substrate 1 is selectively polished as shown in FIG. 1d. This selective polishing is performed for example by causing rotation of a ceramic platen of a surface roughness of 0.01 μm, dropping on the surface of this platen an alkaline solution of a pH 10.5 (polishing solution) in which is dispersed 5.0 wt % of high purity silica particulates of a particle size of 0.02 μm, and pressing and grinding the active layer substrate 1 on the surface of the platen with a pressure of 100 g/cm².

If this selective polishing is performed, the active layer substrate 1 is gradually polished. When the platen reaches the oxide film 3 comprised of the $SiO_2$, since the oxide film 3 is harder to chemical-mechanically polish compared with the active layer substrate 1, the oxide film 3 acts as a stopper to the selective polishing and the polishing speed rapidly drops.

By detecting this polishing speed, it is possible to obtain a thin film SOI structure wafer in a state as shown in FIG. 1d with the oxide film 3 exposed from the surface of the active layer substrate 1, that is, in a state with the active layer 6 separated by the oxide film 3.

Note that the embodiment explained above was described for facilitating the understanding of the first aspect of the invention and was not described for limiting the present invention. Accordingly, the elements described in the above embodiments include all design modifications and equivalents falling under the technical scope of the present invention.

In the above-mentioned embodiment, a specific example was given of the use of the process of polishing and the process of production of a semiconductor substrate of the present invention in the case of producing an SOI structure semiconductor substrate using the binding technique, but the present invention can be applied to other fields as well as a process for polishing a general oxide film.

Second Embodiment

FIGS. 3a to 3d are cross-sectional views of the process of production of a semiconductor substrate according to an embodiment of the second aspect of the invention and explains as an example a process for fabrication of a silicon wafer of an SOI structure having a burying insulating layer. Further, FIGS. 4a to 4d are cross-sectional views of a process of production of a semiconductor substrate according to another embodiment of the second aspect of the invention and is an example of the process of fabrication of a silicon wafer of an SOI structure having the same burying insulating layer.

Figure 3A:
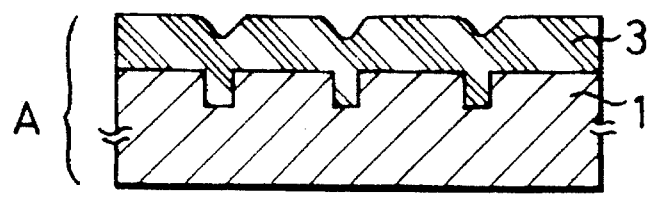
FIGS. 3a to 3d are cross-sectional views of a process of production of a semiconductor substrate according to a first embodiment of the second aspect of the invention.
Figure 4A:
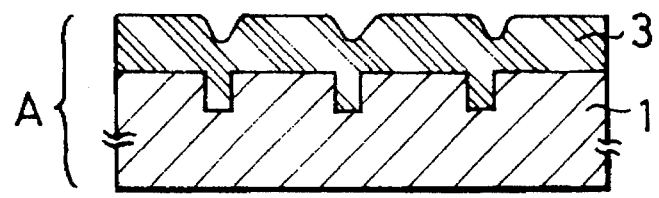
FIGS. 4a to 4d are cross-sectional views of a process of production of a semiconductor substrate according to another embodiment of the second aspect of the invention.

First, as shown in FIG. 3a and FIG. 4a, a photolithographic or etching technique is used to form for example grooves of a depth of 0.1 μm at intervals of 500 μm on one surface of a semiconductor substrate 1 comprised of a single crystal silicon (hereinafter also referred to as the active layer substrate A or the active layer substrate 1).

This surface is thermally oxidized to form an $SiO_2$ film of a thickness of 0.1 μm and further the CVD method is used to form an $SiO_2$ film of a thickness of 0.9 μm on the $SiO_2$ film by heat oxidation.

The 1.0 μm $SiO_2$ film constitutes the surface layer 3 of the active layer substrate (hereinafter also referred to as the oxide film 3 or the silicon oxide film 3), but this oxide film 3 is formed as a surface with step differences as shown in the figure in accordance with the shape of the surface of the patterned active layer substrate A.

Next, in the process of polishing of the present embodiment, the silicon oxide film 3 is directly polished.

In the polishing of the silicon oxide film 3, use is made of a polishing agent including cerium oxide $CeO_2$ as its main component. The solid content (NV) of the cerium oxide in the polishing agent is not particularly limited, but use may be made of one of about 1 to 10 percent.

The pH of the polishing agent is not particularly limited, but if the pH is adjusted to a neutral one of about 7, the selective polishing ratio between the silicon substrate and the silicon oxide film becomes:

$$Si:SiO_2=100:391\approx1:4$$

which is advantageous to the polishing performance on the silicon oxide film (polishing agent T, see FIG. 4).

On the other hand, if the pH of the polishing agent comprised of cerium oxide as its main component is adjusted to 9 to 11, the selective polishing ratio between the silicon substrate and the silicon oxide becomes $$Si:SiO_2=100:83$$

and the selective polishing ratio of the silicon oxide film to the silicon substrate becomes slightly small (polishing agent W, see FIG. 3).

Figure 4B:
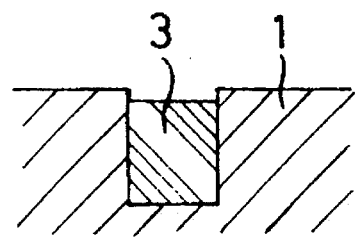

In this embodiment, when directly polishing the silicon oxide film 3, the difference of the selective polishing ratios of the silicon substrate 1 and the silicon oxide film 3 is used for the flattening. For example, when polishing the silicon oxide film 3 from the state shown in FIG. 4a, use of the polishing agent T ($Si:SiO_2\approx1:4$) as shown in FIG. 4b is advantageous for the polishing of the silicon oxide film 3. Further, even if polishing proceeds in the state with the polished face inclined, when the polishing agent reaches the silicon substrate, the polishing at that portion is suppressed. Accordingly, polishing of the other portions of the silicon oxide film progresses and as a result, as shown in FIG. 4b, it is possible to obtain a flat polished face free from inclination.

Figure 3B:
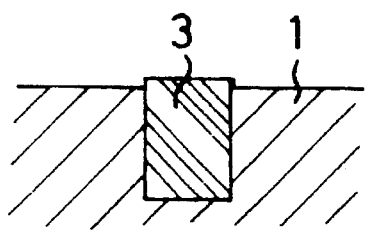

When polishing the silicon oxide film 3 from the state shown in FIG. 3a, the silicon oxide film 3 may be directly polished using the polishing agent W ($Si:SiO_2=100:83$) as shown in FIG. 3b. In this case, the polishing ratio of the silicon oxide film becomes somewhat inferior to the case of use of the polishing agent T, but as shown in FIG. 3b, it is possible to obtain a flat face free from inclination as the polished face.

Figure 5A:
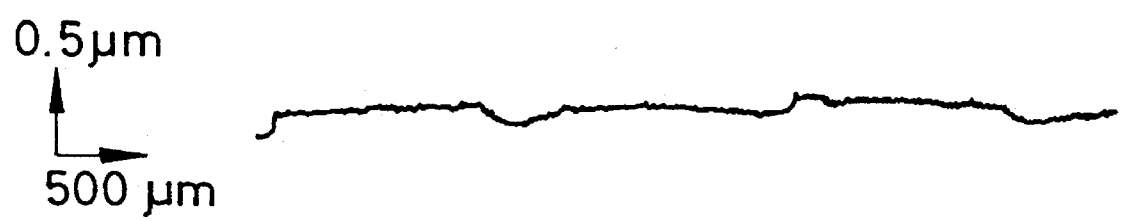
Figure 5B:
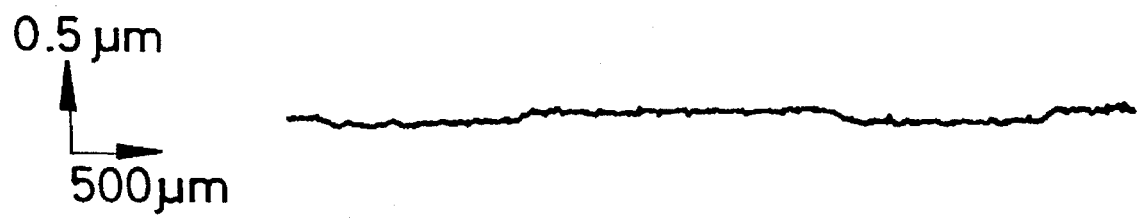

The results of the case of polishing of the silicon oxide film 3 by the polishing agent are shown in FIGS. 5a and 5b.

FIG. 5a is a chart of the measurement of the polished face after the step of FIG. 4b, that is, polishing by the polishing agent T. A recessed state of the silicon oxide film with a step difference of about 0.1 μm was shown.

As opposed to this, FIG. 5b is a chart of the measurement of the polished face after the step of FIG. 3b, that is, polishing using the polishing agent W. A protruding state of the silicon oxide film with a step difference of about 0.1 μm (conversely, a recessed state of the silicon substrate) was shown.

Note that when performing this polishing, the polishing is performed using a rigid platen and with a polishing pressure of 200 g/cm$^2$, a relative speed between the polishing agent and the wafer of 75 rpm, and a polishing speed of 70 nm/min.

The rigid platen is comprised by a flat ceramic platen etc. not susceptible to mechanical or heat deformation. On the surface of the polishing face of this rigid platen, it is possible to apply a thin coat of a hot melt wax having mixed in it a polishing agent comprised primarily of cerium oxide. In the conventional polishing using a cloth, in particular when there were step differences in the polished face, the elastically deformed cross cloth would polished even the recessed portions of the step difference by about the same polishing speed as the general surface and it was extremely difficult to flatten the mirror surface.

However, in the process for polishing of the present embodiment, since use is made of a rigid platen which free from elastic deformation, if the polished face has the step differences as shown in FIG. 3a and FIG. 4a, first just the protruding portions pressed against by the platen are gradually polished. In this way, the step differences between the protruding portions and the recessed portions are gradually reduced and as a result it is possible to obtain a flat mirror surface.

Next, the polished face polished by the step of FIG. 3b or FIG. 4b is further polished to become a mirror surface in state and obtain the binding bonding face 3a.

In this case, in the step of FIG. 3b, the silicon oxide film 3 projects out from the front surface, so the polishing is performed using a polishing agent with a large selective polishing ratio of the silicon oxide film 3 to the silicon substrate 1.

Figure 3C:
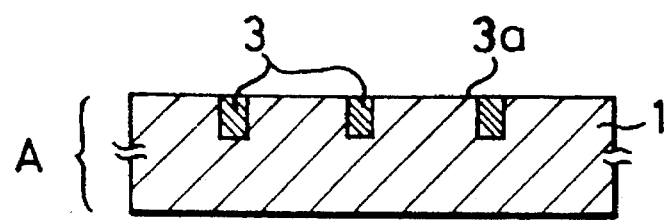

As a polishing agent with a large ratio of selective polishing of the silicon oxide film to the silicon substrate, it is preferable to use the above-mentioned polishing agent T comprised primarily of the cerium oxide. If this is done, the silicon substrate 1 serves as the polishing stopper, so it becomes possible to polish the polished face as a whole to a mirror surface state as shown in FIG. 3c.

Conversely, in the step of FIG. 4b, the silicon substrate 1 projects out from the surface, so the polishing is performed using a polishing agent with a large ratio of selective polishing of the silicon substrate 1 to the silicon oxide film 3.

As a polishing agent with a large ratio of selective polishing of the silicon substrate to the silicon oxide film, use may also be made of a polishing agent comprised primarily of high purity silica particulates or silicon tetrachloride conventionally used for polishing a polycrystalline silicon film.

Figure 4C:
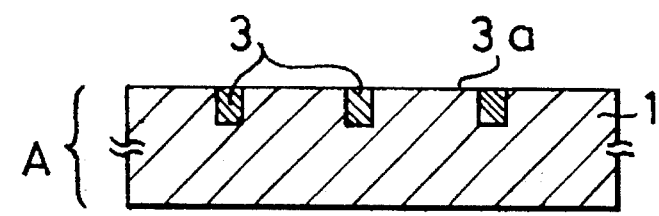

In particular, the selective polishing ratio of the polishing agent comprised primarily of the high purity silica particulates and silicon tetrachloride is $$Si:SiO_2=100:1 \text{ to } 2$$

so this may be said to be the optimal polishing agent for polishing the wafer obtained in the step of FIG. 4b. If this is done, then the silicon oxide film 3 serves as a polishing stopper, so even in this case it becomes possible to polish the polished face as a whole as shown in FIG. 4c.

Note that to eliminate the step difference between the silicon oxide film 3 and the silicon substrate 1, in the final polishing step, it is desirable to perform the polishing using a polishing agent with a substantially equal selective polishing ratio of the silicon substrate and the silicon oxide film.

In the above step, one of the semiconductor substrates for constituting the SOI structure wafer, that is, the active layer substrate A having a mirror surface, is obtained.

Figure 3D:
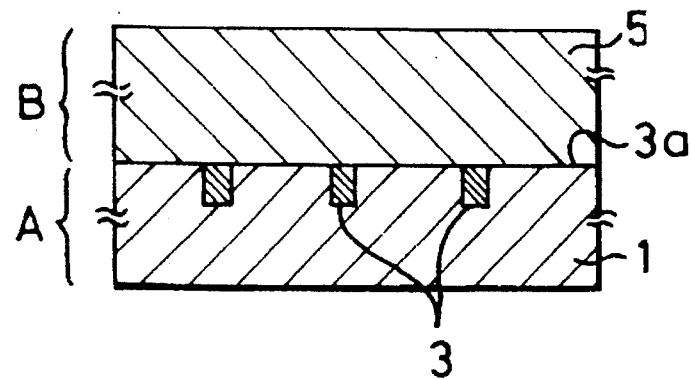
Figure 4D:
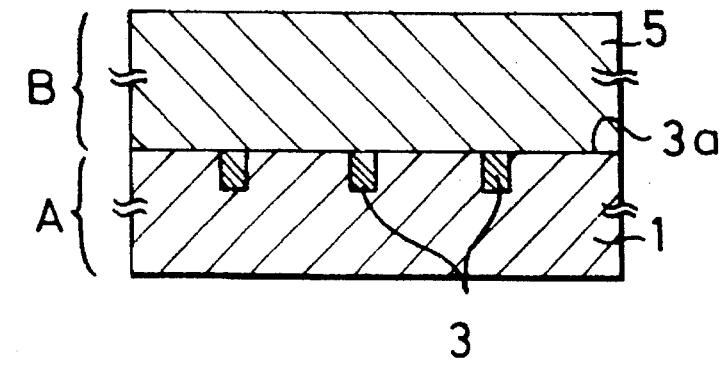

To obtain the bonding face 3a with the mirror surface state shown in FIG. 3c and FIG. 4c, next another semiconductor substrate serving as the support substrate B (hereinafter also referred to as the support substrate 5) is brought into close contact with the bonding face 3a and heat bonding is caused by hydrogen bonds to laminate the two (see FIG. 3d and FIG. 4d).

The binding strength is preferably for example at least 200 kg/cm$^2$ and the binding temperature 1100° C. Further, to prevent warpage of the SOI wafer due to the difference of heat deformation, it is preferable to use the same silicon substrate as the active layer substrate 1 for the support substrate 5.

It is possible in this way to obtain a thin film SOI structure wafer buried with an insulating layer 3.

Note that the embodiment explained above was described for facilitating the understanding of the second aspect of the invention and was not described for limiting the present invention. Accordingly, the elements disclosed in the above embodiments include all design modifications and equivalents falling under the technical scope of the present invention.

For example, when polishing the oxide film shown in FIG. 3a and FIG. 4a, it is preferable to form the oxide film 6 on the back surface of the substrate 1 as well for prevent warpage of the substrate and to alternately and gradually polish the oxide films 3 and 6 formed on the front and back of the substrate.

FIGS. 6a to 6e are cross-sectional views showing this embodiment. Since a silicon oxide film 6 is inevitably formed on the back surface of the silicon substrate 1 by the CVD method etc., it is sufficient to make use of this silicon oxide film.

Figure 6A:
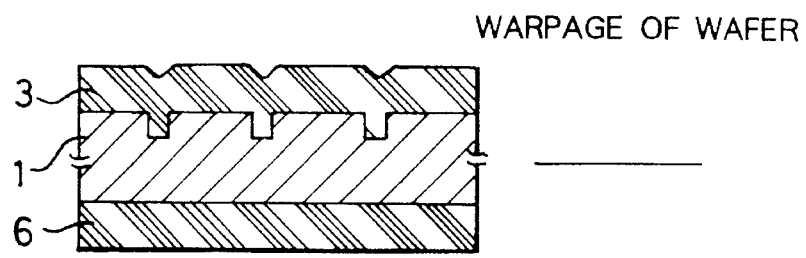
Figure 6B:
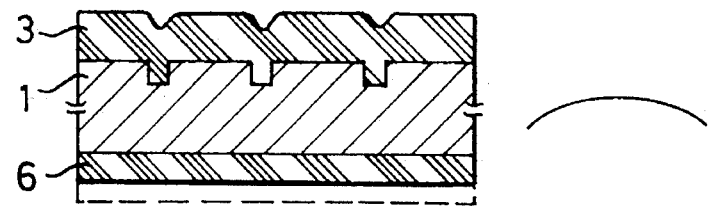
Figure 6C:
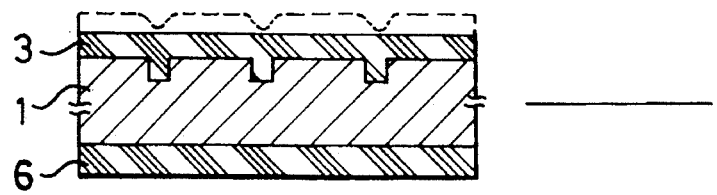
Figure 6D:
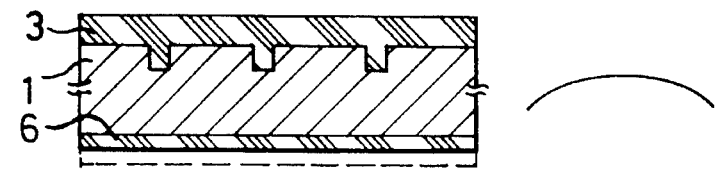
Figure 6E:
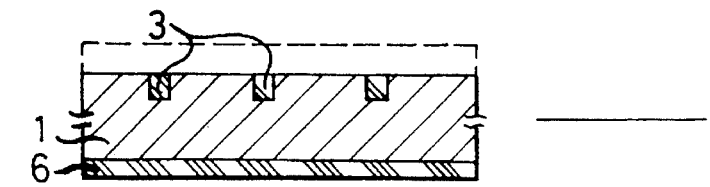
Figure 7A:
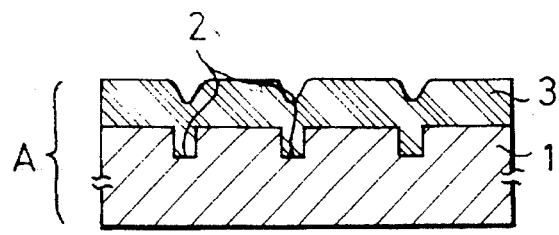
FIGS. 7a to 7e are cross-sectional views of the conventional process of production of a semiconductor substrate.
Figure 7B:
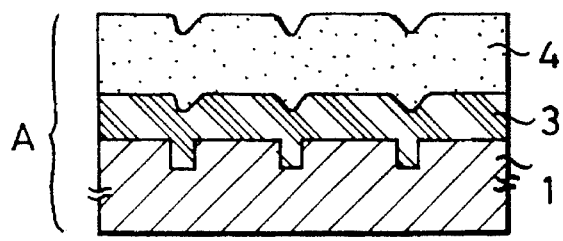
Figure 7C:
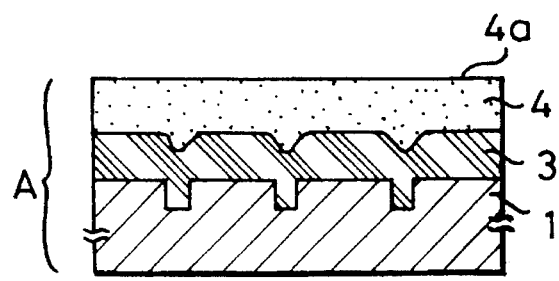
Figure 7D:
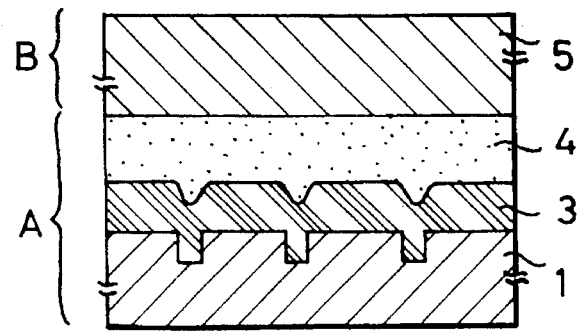
Figure 7E:
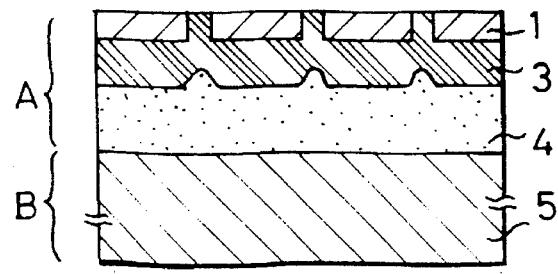

As shown in FIG. 6a, this silicon substrate 1 with the approximately 1 μm silicon oxide films 3 and 6 formed on the front and back is processed to polish just about 0.4 μm of the silicon oxide film 6 on the back surface (see FIG. 6b). By this polishing, the warpage of the silicon substrate as a whole becomes a protruding shape as shown at the right of FIG. 6b. Next, when the silicon oxide film 3 formed on the front surface of the silicon substrate 1 is polished by substantially the same thickness, the warpage of the silicon substrate as a whole is eliminated (see FIG. 6c).

In this way, if the front and back silicon oxide films 3 and 6 of substantially equal thickness are alternately polished (see FIGS. 6d and 6e), the finally obtained silicon substrate 1 becomes an excellent substrate with no warpage.

By adopting this step, not only is there the effect that it is possible to obtain a warp-free flat substrate as the final silicon substrate, but also a silicon substrate with little warpage is therefore polished at the intermediate polishing step, so the flattening effect of the polished face due to the rigid platen is further promoted.

In the above-mentioned embodiment, a specific example was given of the use of the process of polishing and the process of production of a semiconductor substrate of the present invention in the case of producing an SOI structure semiconductor substrate having a burying insulating layer and using the binding technique, but the present invention can be applied to other fields as well as a process for polishing a general oxide film.

CAPABILITY OF EXPLOITATION IN INDUSTRY

As explained above, according to the first aspect of the present invention, since the process is characterized by polishing an oxide film formed on a surface of a semiconductor substrate and having a step difference by a rigid platen using a polishing agent comprised primarily of cerium oxide, there is no need for the step of formation of the polycrystalline silicon film for bonding required in the conventional process of production.

As a result, by forming an oxide film having a step difference on at least one surface of one semiconductor substrate, using a polishing agent comprised primarily of cerium oxide and a rigid platen to polish the oxide film and form a bonding face, then laminating another semiconductor substrate on the bonding face, it is possible to obtain a semiconductor substrate of a SOI structure without forming a polycrystalline silicon film.

Further, according to the second aspect of the invention, in directly polishing the oxide film formed on the surface of the semiconductor substrate by cerium oxide, the pH value of the polishing agent comprised primarily of the cerium oxide is suitably set, so it is possible to obtain a polished face able to satisfy the requirements for flatness in binding.

As a result, by laminating another semiconductor substrate on the polished face, it is possible to obtain a semiconductor substrate of a thin film SOI structure.

I claim:

1. A process of polishing a semiconductor substrate characterized by polishing an oxide film formed on a surface of a semiconductor substrate and having step differences by a rigid platen using a polishing agent comprised primarily of cerium oxide.

2. A process of producing a semiconductor substrate characterized by forming an oxide film having step differences on at least one side of one semiconductor substrate and polishing said oxide film by a rigid platen using a polishing agent comprised primarily of cerium oxide to form a bonding face, then laminating another semiconductor substrate on said bonding face.

3. A process of polishing a semiconductor substrate characterized by using a polishing agent comprised primarily of cerium oxide adjusted to a equal or greater ratio of selective polishing of an oxide film to said semiconductor so as to polish by a rigid platen an oxide film patterned on the surface of said semiconductor substrate.

4. A process of polishing a semiconductor substrate as set forth in claim 3, characterized in that said polished face obtained by the process of polishing as set forth in claim 3 is further polished by a rigid platen using a polishing agent adjusted to an equal or greater ratio of selective polishing of said semiconductor to said oxide film.

5. A process of polishing a semiconductor substrate characterized by using a polishing agent comprised primarily of cerium oxide adjusted to a slightly smaller ratio of selective polishing of an oxide film to said semiconductor so as to polish by a rigid platen an oxide film patterned on the surface of said semiconductor substrate.

6. A process of polishing a semiconductor substrate as set forth in claim 5, characterized in that the polished face obtained by the process of polishing as set forth in claim 5 is further polished by a rigid platen using a polishing agent comprised primarily of cerium oxide adjusted to an equal or greater ratio of selective polishing of the oxide film to said semiconductor.

7. A process of polishing a semiconductor substrate as set forth in any one of claims 3 to 6, characterized by forming an oxide film on a back surface of said semiconductor substrate and, when polishing said oxide film patterned on the front surface of said semiconductor substrate, alternately polishing said oxide film formed on the front and back surfaces of said semiconductor substrate.

8. A process of producing a semiconductor substrate as set forth in claim 4 or 6, characterized by laminating another semiconductor substrate to the polished face obtained by the process of polishing said semiconductor substrate according to claim 4, 6, or 7.

9. A process of producing a semiconductor substrate as set forth in claim 7, characterized by laminating another semiconductor substrate to the polished face obtained by the process of polishing said semiconductor substrate according to claim 7.

* * * * *